(12) United States Patent
Proebsting et al.

(10) Patent No.: US 6,972,596 B1
(45) Date of Patent: Dec. 6, 2005

(54) METHOD AND APPARATUS FOR AMPLIFYING CAPACITIVELY COUPLED INTER-CHIP COMMUNICATION SIGNALS

(75) Inventors: Robert Proebsting, Sonora, CA (US); Robert J. Bosnyak, Tacoma, WA (US)

(73) Assignee: Sun Microsystems, Inc., Santa Clara, CA (US)

( * ) Notice: Subject to any disclaimer, the term of this patent is extended or adjusted under 35 U.S.C. 154(b) by 94 days.

(21) Appl. No.: 10/772,106

(22) Filed: Feb. 3, 2004

(51) Int. Cl.[7] .......................................... H03K 19/094
(52) U.S. Cl. .......................................... 326/83; 326/34
(58) Field of Search ........................ 326/31–34, 82–83, 326/86–88; 327/108–109

(56) References Cited

U.S. PATENT DOCUMENTS

| | | | |
|---|---|---|---|
| 4,080,539 A * | 3/1978 | Stewart ........................ | 326/81 |
| 5,852,370 A * | 12/1998 | Ko ................................. | 326/81 |
| 6,847,231 B2 * | 1/2005 | Kinugawa et al. ............ | 326/82 |

* cited by examiner

Primary Examiner—James H. Cho
(74) Attorney, Agent, or Firm—Park, Vaughan & Fleming, LLP (57) ABSTRACT

One embodiment of the present invention provides a system that amplifies capacitively coupled inter-chip communication signals. During operation, the system transmits a signal through a capacitive transmitter pad and receives a corresponding input signal through a capacitive receiver pad. The system amplifies the input signal by feeding it through a number of cascaded CMOS inverters operating from ever-increasing power supply voltages from the first to the last inverter. The system periodically initializes the input voltage of the first CMOS inverter by: suspending data transmission on the capacitive transmitter pad and setting the voltage on the capacitive transmitter pad to a middle point between a voltage that represents logic "1" and a voltage that represents logic "0", coupling the output of the first CMOS inverter to its input through a switch, and, after the input voltage of the first CMOS inverter stage substantially stabilizes at the switching threshold, uncoupling the output of the first CMOS inverter stage from the input of the first CMOS inverter stage and then resuming data transmission on the capacitive transmitter pad.

27 Claims, 6 Drawing Sheets

(PRIOR ART)

METHOD AND APPARATUS FOR AMPLIFYING CAPACITIVELY COUPLED INTER-CHIP COMMUNICATION SIGNALS

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to the process of transferring data between integrated circuits. More specifically, the present invention relates to a method and an apparatus for amplifying capacitively coupled inter-chip communication signals.

2. Related Art

Advances in semiconductor technology presently make it possible to integrate large-scale systems, including hundreds of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem creates a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled with receiver pads on the second chip, it becomes possible to transmit signals directly from the first chip to the second chip without having to route the signal through intervening signal lines within a printed circuit board.

However, it is not a simple matter to transmit and receive signals across capacitive pads. One problem is signal attenuation due to relatively large capacitance caused by layers of metal and silicon dioxide underneath the capacitive pad. This problem can be reduced substantially by transmitting the signal differentially and by amplifying the attenuated differential signal with a differential amplifier. Unfortunately, this requires two capacitive transmitter and receiver pads for each signal. Moreover, a differential amplifier constantly consumes power unless a more complicated latching differential amplifier requiring careful timing is used.

Hence, what is needed is a method and an apparatus for amplifying non-differential, capacitively coupled inter-chip communication signals which compensates for signal attenuation and minimizes power consumption.

SUMMARY

The present invention presents a circuit design which can amplify attenuated capacitively coupled signals by using cascaded multi-stage CMOS inverters. It significantly decreases power consumption by progressively biasing each CMOS inverter stage such that either the PMOS transistor or the NMOS transistor of each inverter stage can be turned off by its respective input signal, which is the output signal from its previous stage.

To achieve the best result, the present invention uses diode-connected PMOS and NMOS transistors for biasing the PMOS and NMOS source voltages of each inverter. This is because the diode-connected PMOS and NMOS transistors have the same threshold voltages as do the PMOS and NMOS transistors in CMOS inverters, respectively. This configuration ensures that the output of each stage of CMOS inverter can sufficiently turn off either the PMOS transistor or the NMOS transistor of the CMOS inverter in the subsequent stage, thus saving power. It also ensures that the circuit will guarantee to function regardless of different threshold voltages of the PMOS and NMOS transistors that comprise CMOS inverters.

One embodiment of the present invention provides a system that amplifies capacitively coupled inter-chip communication signals. During operation, the system transmits a signal through a capacitive transmitter pad and receives a corresponding input signal through a capacitive receiver pad. The system amplifies the input signal by feeding it through a number of cascaded CMOS inverters. The system periodically initializes the input voltage of the first CMOS inverter by: suspending data transmission on the capacitive transmitter pad and setting the voltage on the capacitive transmitter pad to a middle point between a voltage that represents logic "1" and a voltage that represents logic "0", coupling the output of the first CMOS inverter to its input through a switch, and, after the input voltage of the first CMOS inverter stage substantially stabilizes at the switching threshold, uncoupling the output of the first CMOS inverter stage from the input of the first CMOS inverter stage and resuming data transmission on the capacitive transmitter pad.

In a variation of this embodiment, coupling the output of the first CMOS inverter stage to its input involves coupling its output to its input through a switch, which is turned on during the initialization.

In a further variation of this embodiment, the switch comprises one of an NMOS transistor, a PMOS transistor, and a CMOS switch.

In a variation of this embodiment, the preferred number of CMOS inverter stages is the minimum number satisfying inequality $[(V_{PHIGH}-V_{PLOW})-n \cdot |V_{TP}|-n \cdot |V_{TN}|] \leq v_{in}$, where n is the number of CMOS inverter stages; $V_{PHIGH}$ is the high power supply voltage; $V_{PLOW}$ is the low power supply voltage; $V_{TP}$ is the turn-on threshold voltage of a PMOS transistor that comprises a CMOS inverter (gate-to-source voltage drop); $V_{TN}$ is the turn-on threshold voltage of a NMOS transistor that comprises a CMOS inverter (gate-tosource voltage drop); and $v_{in}$ is the peak-to-peak swing of the input signal received from the capacitive receiver pad.

In a further variation of this embodiment, the PMOS source voltage of each CMOS inverter stage is equal to or higher than the PMOS source voltage of its immediately preceding CMOS inverter stage; and the NMOS source voltage of each CMOS inverter stage is equal to or lower than the NMOS source voltage of its immediately preceding CMOS inverter stage.

In a further variation of this embodiment, obtaining the PMOS source voltage of each CMOS inverter stage involves coupling a number of diode-connected PMOS transistors in series between the high power supply voltage and the PMOS source of each CMOS inverter, and obtaining the NMOS source voltage of each CMOS inverter stage involves coupling a number of diode connected NMOS transistors in series between the low power supply voltage and the NMOS source of each CMOS inverter.

In a further variation of this embodiment, the PMOS source voltage and NMOS source voltage of each CMOS inverter stage are $[V_{PHIGH}-(n-i)\cdot|V_{TP}|]$ Volts and $[V_{PLOW}+(n-i)\cdot|V_{TN}|]$ Volts, respectively, where i=1, 2, . . . n is the index of each stage, and where the index of the first stage is 1 and the index of the last stage is n.

In a further variation of this embodiment, obtaining the PMOS source voltage of each CMOS inverter stage involves coupling (n-i) diode-connected PMOS transistors in series between the high power supply voltage and the PMOS source of each CMOS inverter, and obtaining the NMOS source voltage of each CMOS inverter stage involves coupling (n-i) diode-connected NMOS transistors in series between the low power supply voltage and the NMOS source of each CMOS inverter.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Inter-Chip Communication through Capacitive Coupling

Figure 1:
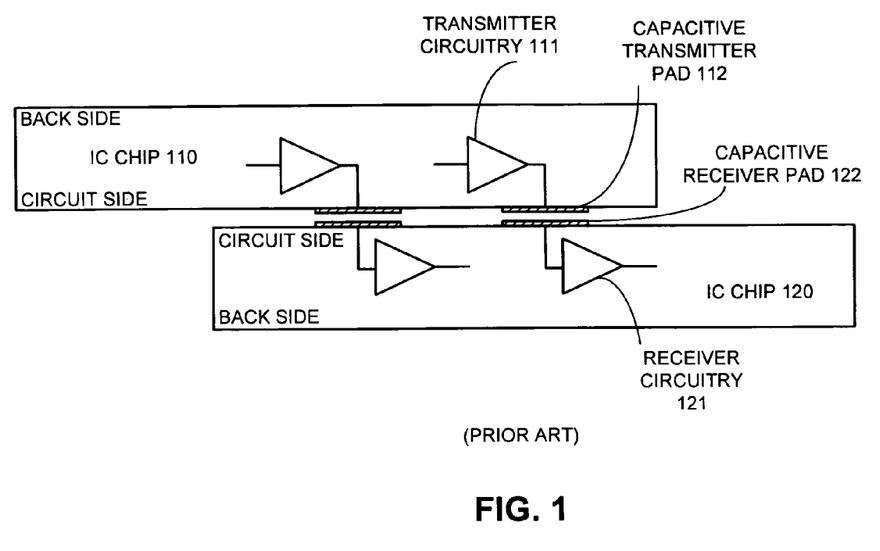
FIG. 1 illustrates inter-chip communication through capacitive pads.

FIG. 1 illustrates inter-chip communication through capacitive pads in accordance with an embodiment of the present invention. The transmitting integrated circuit (IC) chip 110 contains transmitter circuitry 111, which feeds a signal into a capacitive transmitter pad 112. The signal is capacitively transmitted to capacitive receiver pad 122, and then passes into receiver circuitry 121 located in receiving IC chip 120. Note that when the transmitter and receiver pads are properly aligned, there is no direct physical contact between the transmitter and receiver pads, and signals are transmitted through capacitive coupling.

Amplifier Circuit

Figure 2:
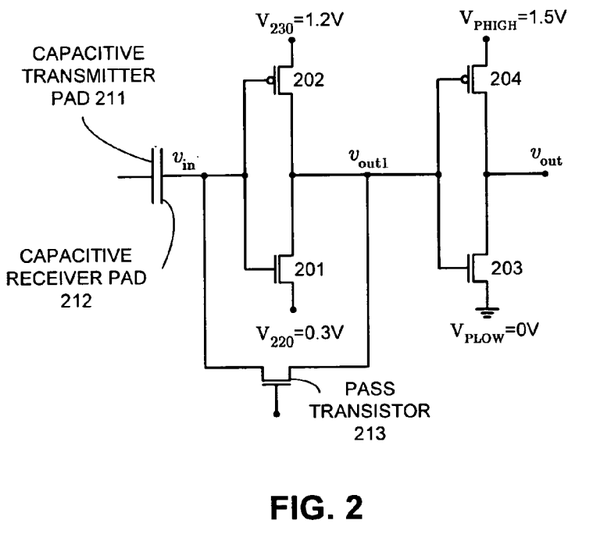
FIG. 2 illustrates an amplifier circuit that includes two CMOS inverter stages and a pass transistor in accordance with an embodiment of the present invention.

FIG. 2 illustrates an amplifier circuit that includes two CMOS inverter stages and a pass transistor in accordance with an embodiment of the present invention. As capacitive receiver pad 212 receives signal from a capacitive transmitter pad 211, the received signal ($v_{in}$) is typically attenuated. For example, if the transmitted signal has a 1.5 V voltage swing, the received signal, $v_{in}$, might have only a 0.3 V voltage swing. To amplify $v_{in}$, a CMOS inverter comprising PMOS transistor 202 and NMOS transistor 201 is used.

Suppose there is only one CMOS inverter to amplify the signal, wherein the inverter is powered by a high power supply voltage $V_{PHIGH}=1.5$ V and a low power supply voltage $V_{PLOW}=0$ V. Also, assume that the PMOS turn-on threshold voltage is -0.3 V (measured from gate to source), and that the NMOS turn-on threshold voltage is 0.3 V (measured from gate to source). An input signal swing of 0.3 V in the vicinity of the inverter's switching threshold will not be sufficient to turn off the PMOS or the NMOS transistor, although it is probably sufficient to switch the output close to the 1.5 V rail-to-rail voltage. This is because, to turn off the PMOS transistor, the input voltage should be 1.2 V or higher (so that there is less than 0.3 V between the PMOS gate and source); and to turn off the NMOS transistor, the input voltage should be 0.3 V or lower (so that there is less than 0.3 V between the NMOS gate and source). A total input signal swing of 0.9 V is required to turn off the PMOS or NMOS transistor during operation. An input signal swing of 0.3 V cannot guarantee that either the PMOS or NMOS transistors are turned off; therefore, the inverter will consume a significant amount of power by drawing non-negligible current through both the PMOS and NMOS transistors.

One solution to the above problem is to cascade multiple inverters, as shown in FIG. 2. To ensure that every inverter can be turned off during operation, its input, which is also the output of its immediately preceding inverter stage, should be sufficient to turn off either the PMOS or NMOS transistor of the inverter. Hence, every inverter stage should have progressively smaller voltage drop between its PMOS source and NMOS source, from the last stage to the first stage, to ensure that every stage can be turned off to prevent non-negligible current flow during operation. The very first inverter stage should have the most "squeezed" PMOS source voltage and NMOS source voltage, such that a small input signal $v_{in}$ is sufficient to turn off its PMOS and NMOS transistors.

The next question is how to determine the number of stages needed, and what is the PMOS source voltage and NMOS source voltage for each stage. One approach is to calculate backwards—from the last stage to the first stage. Since the last stage is powered by the rail-to-rail power supply voltages ($V_{PLOW}$=0 V and $V_{PHIGH}$=1.5 V), it is obvious that to turn off its PMOS or NMOS transistors the input signal should have a minimum swing between ($V_{PLOW}$+|$V_{TN}$|)=|$V_{TN}$|Volts and ($V_{PHIGH}$−|$V_{TP}$|)=(1.5−|$V_{TP}$|) Volts, where |$V_{TP}$| and |$V_{TN}$| are magnitude of the turn-on threshold voltages of the PMOS transistor and NMOS transistor, respectively. Correspondingly, the output of the second last stage should swing between ($V_{PLOW}$+|$V_{TN}$|) =|$V_{TN}$| Volts and ($V_{PHIGH}$ −|$V_{TP}$|)=(1.5−|$V_{TP}$|) Volts. Hence, the second last inverter stage's NMOS source voltage should be ($V_{PLOW}$+|$V_{TN}$|)=|$V_{TN}$| Volts and its PMOS source voltage should be ($V_{PHIGH}$−|$V_{TP}$|)=(1.5−|$V_{TP}$|) Volts.

Similarly, for the second last stage to turn off its PMOS or NMOS transistor, its input signal should have a minimum swing between ($V_{PLOW}$+|$V_{TN}$|+|$V_{TN}$|)=2·|$V_{TN}$| Volts and ($V_{PHIGH}$−|$V_{TP}$|−$V_{TP}$|)=(1.5−2·|$V_{TP}$|) Volts. This process continues until the required input signal swing of a stage falls within the range of the received signal. As a result, for the first stage, the received input signal $v_{in}$ swings between n·|$V_{TN}$| Volts (or less) and (1.5−n·|$V_{TP}$|) Volts (or more), where the total number of required stage is n. Each stage's power supply voltages could be [$V_{PLOW}$+(n−i)·|$V_{TN}$|] Volts and [$V_{PHIGH}$−(n−i)·|$V_{TP}$|] Volts, where i=1, 2, . . . n is the index of each stage (the stage that takes the received input signal $v_{in}$ being the first stage, and the stage that outputs rail-to-rail voltages being the nth stage).

In the example in FIG. 2, the input signal $v_{in}$ has an attenuated voltage swing of 0.3 V, and PMOS transistor 204 and NMOS transistor 203 have turn-on threshold voltage of −0.3 V and 0.3 V, respectively. Suppose that $v_{in}$ is directly fed into the inverter comprised of PMOS transistor 204 and NMOS transistor 203.

If $v_{in}$ is centered at 0.45 V, its low level (0.3 V) would just turn off NMOS transistor 203, but its high level (0.6 V) would not turn off either PMOS transistor 204 or NMOS transistor 203, resulting in significant power consumption through the inverter during high level of $v_{in}$.

If $v_{in}$ is centered at 1.05 V, its high level (1.2 V) would just turn off PMOS transistor 204, but its low level (0.9 V) would not turn off either PMOS transistor 204 or NMOS transistor 203, resulting in significant power consumption through the inverter during the low level of $v_{in}$.

If $v_{in}$ is centered at 0.75 V, although the CMOS inverter is functional, it still draws a significant amount of current. When $v_{in}$ is at a high level of 0.9 V, both PMOS transistor 204 and NMOS transistor 203 are turned on. More precisely, NMOS transistor 203 is turned on more than PMOS transistor 204 is. There is a significant amount of current flowing through both PMOS transistor 204 and NMOS transistor 203. Because of the current flowing through PMOS transistor 204, NMOS transistor 203 cannot completely pull the output down to $V_{PLOW}$. Similarly, when $v_{in}$ is at a low level of 0.6 V, both PMOS transistor 204 and NMOS transistor 203 are turned on. More precisely, PMOS transistor 204 is turned on more than NMOS transistor 203 is. There is a significant amount of current flowing through both PMOS transistor 204 and NMOS transistor 203. Because of the current flowing through NMOS transistor 203, PMOS transistor 204 cannot completely pull the output up to $V_{PHIGH}$.

Hence, although a single inverter directly powered by rail-to-rail voltages may be acceptable function-wise, it may not be acceptable in practice because it consumes too much power.

With a given $v_{in}$, the number of stages n in a preferred embodiment is the minimum number that satisfies inequality [($V_{PHIGH}$−$V_{PLOW}$)−n·|$V_{TP}$|−n·|$V_{TN}$|]≤$v_{in}$. While $v_{in}$=0.3 V, |$V_{TP}$|·|$V_{TN}$|=0.3 V, $V_{PHIGH}$=1.5 V, and $V_{PLOW}$=0 V, the above condition yields n≥2. Therefore, the preferred number of stages needed is 2. As shown in FIG. 2, the first stage comprises PMOS transistor 202 and NMOS transistor 201. The first stage's NMOS source voltage could be $V_{PLOW}$+ (2−1)·|$V_{TN}$|=0.3 V, and its PMOS source voltage could be ($V_{PHIGH}$−(2−1)·|$V_{TP}$|)=1.2 V. The last (also the second in this example) stage's PMOS and NMOS source voltages are 0 V and 1.5 V, respectively.

A remaining issue is how to ensure $v_{in}$, to be centered at the first stage's switching threshold, so that the swing of $v_{in}$ can be fully utilized. To resolve this problem, the output of the first stage is coupled to its input through a pass transistor 213. Pass transistor 213 is turned on to initialize the input voltage of the first CMOS inverter. During the initialization, data transmission is suspended and the voltage on capacitive transmitter pad 211 is set to the middle point between the voltage that represents a logic "1" and the voltage that represents a logic "0", so that when data transmission is resumed, the coupled signal can have both a sufficient upward and downward voltage swing. Meanwhile, turning on pass transistor 213 equilibrates $v_{in}$ to the switching-threshold voltage of the first CMOS inverter (0.75 V in this example). After $v_{in}$ stabilizes at the switching-threshold voltage, pass transistor 213 is turned off after which data transmission resumes.

Notice that pass transistor 213 can force $v_{in}$ to be at the CMOS switching threshold with any $V_{TP}$ and $V_{TN}$ values. Also, the initialization may need to be performed periodically to compensate for changes in the gate voltage due to current leakage through pass transistor 213.

Figure 3:
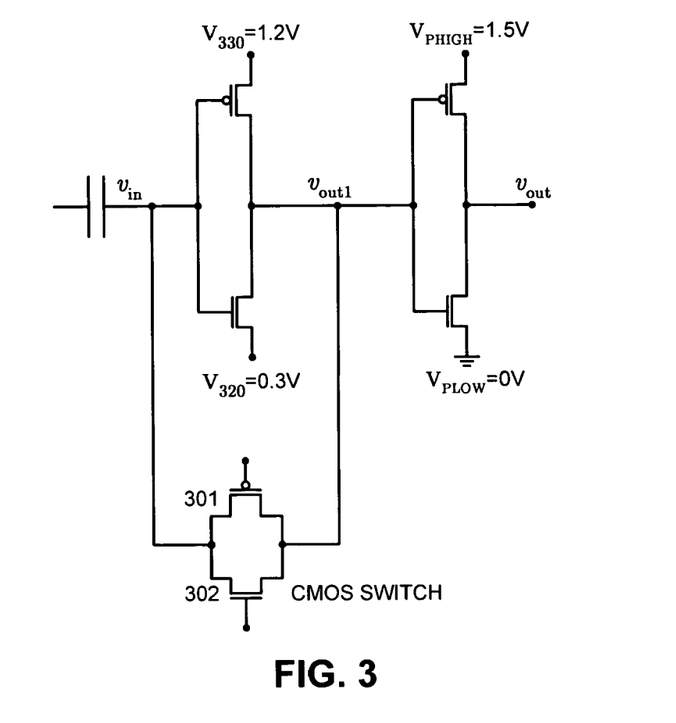
FIG. 3 illustrates an amplifier circuit that includes two CMOS inverter stages and a CMOS switch in accordance with an embodiment of the present invention.

FIG. 3 illustrates an amplifier circuit that includes two CMOS inverter stages and a CMOS switch in accordance with an embodiment of the present invention. Instead of using a single pass transistor to periodically couple the output and input of the first CMOS inverter, a CMOS switch (comprising PMOS transistor 301 and NMOS transistor 302 connected in parallel) is used.

Using Diode-connected Transistors as Biasing Circuits

Figure 4:
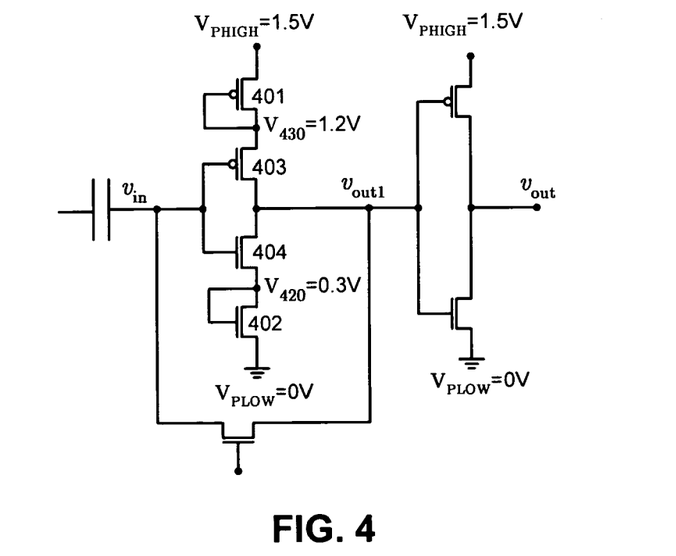
FIG. 4 illustrates using diode-connected transistors to generate biased source voltages for the first CMOS inverter stage in accordance with an embodiment of the present invention.

FIG. 4 illustrates using diode-connected transistors to generate biased source voltages for the first CMOS inverter stage in accordance with an embodiment of the present invention. As previously described, in a multi-stage inverter configuration, each stage's NMOS source voltage could be [$V_{PLOW}$+(n−i)·|$V_{TN}$|] Volts, and its PMOS source voltage could be [$V_{PHIGH}$−(n−i)·|$V_{TP}$|] Volts. The challenge is how to obtain the correctly biased PMOS and NMOS source voltages for each stage.

Since the correct PMOS and NMOS source voltages depend on $V_{TP}$ and $V_{TN}$, using resistors is not an option, because $V_{TP}$ and $V_{TN}$ are usually difficult to be predicted precisely due to variations in fabrication processes. One way to solve this problem is to use diode-connected PMOS and NMOS transistors, which have exactly the same turn-on threshold voltages ($V_{TP}$ and $V_{TN}$) as the PMOS and NMOS transistors used in CMOS inverters, respectively. At each inverter stage, on the PMOS side, one can couple (n−i) diode-connected PMOS transistors in series between $V_{PHIGH}$ and the PMOS source. On the NMOS side, one can couple (n−i) diode-connected NMOS transistors in series between $V_{PLOW}$ and the NMOS source. This design ensures that regardless of what $V_{TP}$ and $V_{TN}$ are, every inverter stage is always correctly biased.

As shown in FIG. 4, a diode-connected PMOS transistor 401 with threshold voltage of −0.3 V is coupled between the high power supply voltage $V_{PHIGH}$ and the source of PMOS transistor 403 of the CMOS inverter. This produces a biased high supply voltage of 1.2 V ($V_{430}$) for the CMOS inverter. Similarly, a diode-connected NMOS transistor 402 is coupled between the low power-supply voltage $V_{PLOW}$ and the source of NMOS transistor 404 of the CMOS inverter to produce a biased low supply voltage of 0.3 V ($V_{420}$).

Three-Stage Amplifier Circuit

Figure 5A:
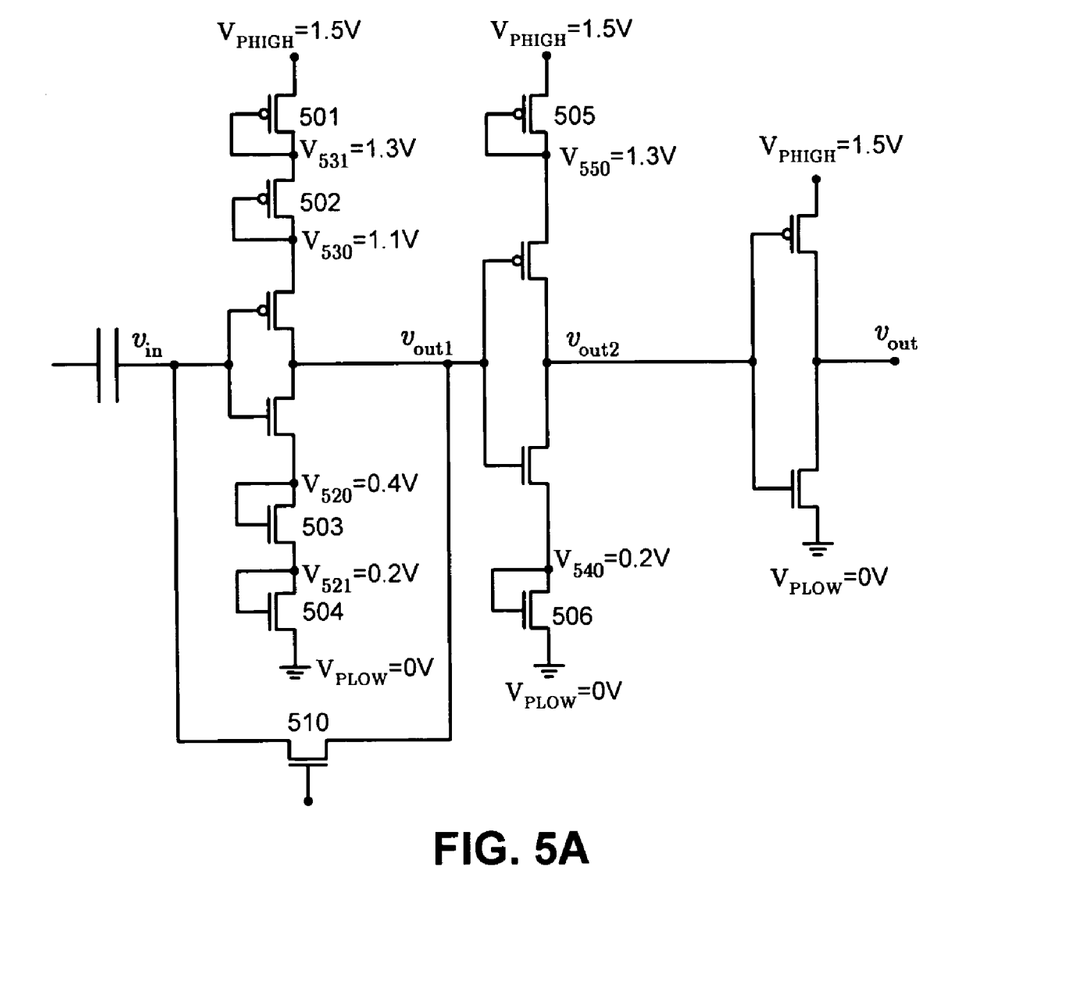
FIG. 5A illustrates an amplifier circuit incorporating three CMOS inverter stages and a pass transistor that uses diode-connected transistors coupled in series to bias the first two CMOS inverter stages in accordance with an embodiment of the present invention.

FIG. 5A illustrates an amplifier circuit incorporating three CMOS inverter stages and a pass transistor that uses diode-connected transistors coupled in series to bias the first two CMOS inverter stages in accordance with an embodiment of the present invention. In this example, threshold voltages for the PMOS and NMOS transistors ($V_{TP}$ and $V_{TN}$) are assumed to be −0.2 V and 0.2 V, respectively. Similarly, the magnitude of a diode-connected transistor's turn-on threshold voltage is also 0.2 V. In this case, the two-stage configuration illustrated in FIGS. 2–4 can no longer maintain a low power consumption.

As shown in FIG. 5A, a three-stage design is used to amplify an input signal $v_{in}$ with a peak-to-peak voltage swing of 0.3 V. In the first inverter stage, the high supply voltage $V_{530}$ is 1.1 V, which is obtained by coupling two diode-connected PMOS transistors 501 and 502 in series between the high power-supply voltage $V_{PHIGH}$ and the source of the PMOS transistor of the first inverter stage. Similarly, the low supply voltage $V_{520}$ is 0.4 V, which is obtained by coupling two diode-connected NMOS transistors 520 and 521 in series between the low power-supply voltage $V_{PLOW}$ and the source of the NMOS transistor of the first inverter stage.

During initialization, data transmission is suspended, and the capacitive transmitter pad is held at a middle point voltage between the voltage that represents a logic "1" (which in this example is the high power-supply voltage of 1.5 V) and the voltage that represents a logic "0" (which in this example is the low power-supply voltage of 0 V). Pass transistor 510 is then turned on, drawing $v_{in}$ to the switching-threshold voltage of the first inverter stage, which is 0.75 V in this example. After $v_{in}$ stabilizes at the switching-threshold voltage, pass transistor 510 is turned off after which data transmission resumes.

Because of the stray capacitance on the receiving chip, the signal voltage swing from the capacitive transmitter pad may be attenuated. Assuming that the signal voltage swing on the capacitive transmitter pad is 1.5 V (0–1.5 V), and there is a 5-to-1 attenuation, the received signal voltage swing on the capacitive receiver pad $v_{in}$ will be reduced to 0.3 V. Since $v_{in}$ is stabilized at the switching-threshold voltage (0.75 V) during initialization, the 0.3 V swing will be centered at 0.75 V, i.e., $V_{in}$ will have a peak-to-peak voltage swing between 0.6 V and 0.9V.

When $v_{in}$ is at its low level of 0.6 V, the NMOS transistor of the first inverter stage is just turned off, because the NMOS transistor's source voltage $V_{520}$ is 0.4 V, and its gate-to-source voltage drop is 0.2 V, which barely meets with the NMOS threshold voltage. Therefore, there will not be a significant amount of current flowing through the NMOS transistor of the first inverter stage. The 0.6 V input turns on the PMOS transistor whose source is at 1.1 V. Consequently, the output of the first inverter stage, $v_{out1}$, is brought to $V_{530}$ (1.1 V) which is two thresholds below $V_{PHIGH}$, and which is enough to turn off the PMOS transistor in the second-stage CMOS inverter.

When $v_{in}$ is at its high level of 0.9 V, the PMOS transistor of the first inverter stage is just turned off, because the PMOS transistor's source voltage $V_{530}$ is 1.1 V, and its gate-to-source voltage drop is −0.2 V, which barely meets with the PMOS threshold voltage. Therefore, there will not be a significant amount of current flowing through the PMOS transistor of the first inverter stage. The 0.9 V input turns on the NMOS transistor whose source is at 0.4 V. Consequently, the output of the first inverter stage, $v_{out1}$, is brought to $V_{520}$ (0.4 V) which is two thresholds above $V_{PLOW}$, and which is enough to turn off the NMOS transistor in the second-stage CMOS inverter.

Since $v_{out1}$ is also the input signal to the second inverter stage, a similar analysis can be performed for the second inverter stage. In the second inverter stage, the high supply voltage $V_{550}$ is 1.3 V, which is obtained by coupling diode-connected PMOS transistor 505 between the high power-supply voltage $V_{PHIGH}$ and the source of the PMOS transistor of the second inverter stage. Similarly, the low supply voltage $V_{540}$ is 0.2 V, which is obtained by coupling one diode-connected NMOS transistor 506 between the low power-supply voltage $V_{PLOW}$ and the source of the NMOS transistor of the second inverter stage.

When $v_{out1}$ is at its low level of 0.4 V, the NMOS transistor of the second inverter stage is just turned off, because the NMOS transistor's source voltage $V_{540}$ is 0.2 V, and its gate-to-source voltage drop is 0.2 V, which barely meets with the NMOS threshold voltage. Therefore, there will not be a significant amount of current flowing through the NMOS transistor of the second inverter stage. The 0.4 V input turns on the PMOS transistor whose source is at 1.3 V. Consequently, the output of the second inverter stage, $V_{out2}$, is brought to $V_{550}$ (1.3 V) which is one threshold below $V_{PHIGH}$, and which is enough to turn off the PMOS transistor in the third-stage CMOS inverter.

When $V_{out1}$ is at its high level of 1.1 V, the PMOS transistor of the second inverter stage is just turned off, because the PMOS transistor's source voltage $V_{550}$ is 1.3 V, and its gate-to-source voltage drop is −0.2 V, which barely meets with the PMOS threshold voltage. Therefore, there will not be a significant amount of current flowing through the PMOS transistor of the second inverter stage. The 1.1 V input turns on the NMOS transistor whose source is at 0.2V. Consequently, the output of the second inverter stage, $V_{out2}$, is brought to $V_{540}$(0.2 V) which is one threshold above $V_{PLOW}$, and which is enough to turn off the NMOS transistor in the third-stage CMOS inverter.

Since $v_{out2}$ is also the input signal to the third inverter stage, a similar analysis can be performed for the third inverter stage. In the third inverter stage, the high supply voltage is the high power-supply voltage $V_{PHIGH}$, which is 1.5 V. Similarly, the low supply voltage is the low power-supply voltage $V_{PLOW}$, which is 0 V.

When $V_{out2}$ is at its low level of 0.2 V, the NMOS transistor of the third inverter stage is just turned off, because the NMOS transistor's source voltage is 0 V, and its gate-to-source voltage drop is 0.2 V, which barely meets with the NMOS threshold voltage. Therefore, there will not be a significant amount of current flowing through the NMOS transistor of the third inverter stage. The 0.2 V input turns on the PMOS transistor whose source is at 1.5 V. Consequently, the output of the third inverter stage, $v_{out}$, is brought to $V_{PHIGH}$ (1.5 V).

When $V_{out2}$ is at its high level of 1.3 V, the PMOS transistor of the third inverter stage is just turned off, because the PMOS transistor's source voltage is 1.5 V, and its gate-to-source voltage drop is −0.2 V, which barely meets with the PMOS threshold voltage. Therefore, there will not be a significant amount of current flowing through the PMOS transistor of the third inverter stage. The 1.3 V input turns on the NMOS transistor whose source is 0 V. Consequently, the output of the third inverter stage, $V_{out}$, is brought to $V_{PLOW}$ (0 V).

In summary, an input signal at a high level of 0.9 V causes the first inverter stage to have an output of 0.4 V, the second inverter stage to have an output of 1.3 V, and the third inverter stage to have an output of 0 V. An input signal at a low level of 0.6 V causes the first inverter stage to have an output of 1.1 V, the second inverter stage to have an output of 0.2 V, and the third inverter stage to have an output of 1.5 V.

It is essential to design a proper number of stages with a given attenuated signal $v_{in}$. In this example, with a given $v_{in}$ of 0.3 V, the preferred number of stages n is the minimum number that satisfies $[(V_{PHIGH}-V_{PLOW})-n \cdot |V_{TP}|-n \cdot |V_{TN}|] \leq v_{in}$. Since $|V_{TP}|=|V_{TN}|=0.2$ V, $V_{PHIGH}=1.5$ V, and $V_{PLOW}=0$ V, the inequality yields $n \geq 3$. Therefore, there should be preferably 3 stages of inverters. The first CMOS inverter has NMOS source and PMOS source voltages of $(3-1)\cdot|V_{TN}|=0.4$ V and $[1.5-(3-1)\cdot|V_{TP}|]=1.1$ V, respectively; wherein the voltages are produced by diode-connected transistors coupled in series (501 and 502 on the PMOS side, 503 and 504 on the NMOS side). The output of the first CMOS inverter, $V_{out1}$, has a signal voltage swing between 0.4 V and 1.1 V. The second CMOS inverter has low and high supply voltages of $(3-2)\cdot|V_{TN}|=0.2$ V and $[1.5-(3-2)\cdot|V_{TP}|]=1.3$ V, respectively, which are produced through diode-connected transistors 505 and 506. The output of the second CMOS inverter, $v_{out2}$, has a signal voltage swing between 0.2 V and 1.3 V. The third CMOS inverter has low and high supply voltages directly obtained from the rail-to-rail power-supply voltages, and further amplifies $v_{out2}$ to produce $v_{out}$ which has a voltage swing between 0 V and 1.5 V.

It should be noted that the preferred number of stages should be the minimum number that satisfies inequality $[(V_{PHIGH}-V_{PLOW})-n\cdot|V_{TP}|-n\cdot|V_{TN}|] \leq v_{in}$. Suppose that the threshold voltages of the PMOS and NMOS transistors are −0.3 V and 0.3 V respectively, the above inequality yields $n \geq 2$. If n is chosen to be 3 instead of 2 (which is the minimum number satisfying the inequality), the first-stage inverter's PMOS source voltage would be 0.9 V and its NMOS source voltage would be 0.6 V, if one uses (n−i) PMOS and NMOS transistors to generate source voltages for each stage. When $v_{in}$ is at its high level of 0.9 V, although the PMOS transistor of the inverter is turned off, the NMOS transistor of the inverter would be hardly turned on since its gate to source voltage drop is exactly 0.3 V, which is equal to its threshold voltage. Consequently, the output of the first inverter would not be completely switched down to 0.6 V. Similarly, when $v_{in}$ is at its low level of 0.6 V, although the NMOS transistor of the inverter is turned off, the PMOS transistor of the inverter would be hardly turned on since its gate to source voltage drop is exactly −0.3 V, which is equal to its threshold voltage. Consequently, the output of the first inverter would not be completely switched up to 0.9 V. Therefore, it may not desirable to over provision the number of inverter stages, since it may result in a non-functional circuit.

Figure 5B:
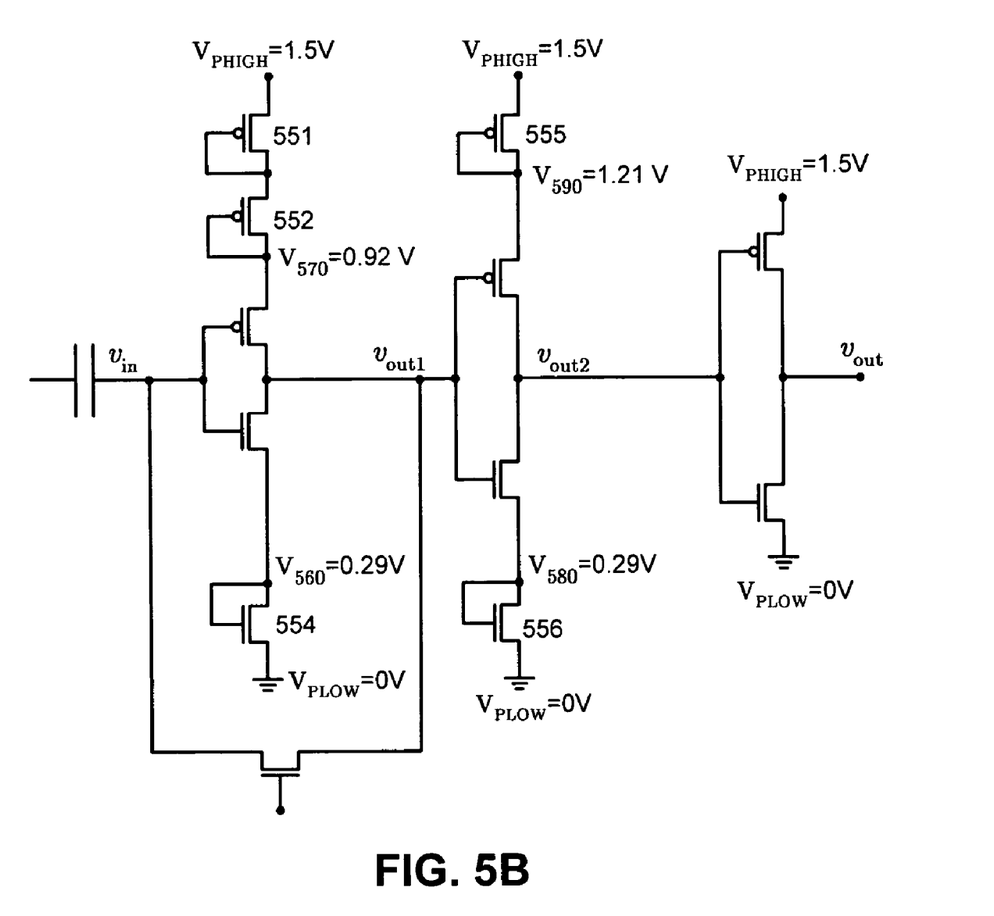
FIG. 5B illustrates one technique to obtain desirable voltage margin for proper switching at each inverter stage according to one embodiment of the present invention.

FIG. 5B illustrates one technique to obtain desirable voltage margin for proper switching at each inverter stage according to one embodiment of the present invention. The example in FIG. 5A illustrates how an input signal with 0.3 V swing can be amplified with PMOS and NMOS transistors of threshold voltages at −0.2 V and 0.2 V respectively. However, the threshold voltages of PMOS and NMOS transistors do not always match so well with the input signal swing, and undesirable situations may occur if one strictly uses (n−i) diode-connected PMOS and NMOS transistors to generate source voltages for each inverter stage.

For example, the PMOS and NMOS transistor's threshold voltages could be −0.29 V and 0.29 V, respectively. If $v_{in}$ has a 0.3 V swing, according to $[(V_{PHIGH}-V_{PLOW})-n\cdot|V_{TP}|-n\cdot|V_{TN}|] \leq v_{in}$, the preferred value of n should be 3. If one uses (n−i) diode-connected PMOS and NMOS transistors to generate source voltages for each state, the first stage would have 0.92 V for its PMOS source voltage, and 0.58 V for its NMOS source voltage. Suppose $V_{in}$ swings between 0.6 and 0.9 V, when $V_{in}$ is at its low level of 0.6 V, the NMOS transistor is turned off; however, the PMOS transistor is turned on only by 0.02 V beyond its threshold voltage. Similarly, when $v_{in}$ is at its high level of 0.9 V, the PMOS transistor is turned off; however, the NMOS transistor is turned on only by 0.02 V beyond its threshold voltage. As a result, the switching speed of the first inverter stage is significantly reduced due to the small voltage margin beyond the threshold voltages of the PMOS and NMOS transistors.

One approach to obtain proper voltage margins for faster switching is to reduce the number of diode-connected transistors on either the PMOS or NMOS side, as shown in FIG. 5B. In this example, there is only one diode-connected NMOS transistor 554 to generate source voltage for the NMOS transistor of the first stage, while the PMOS source voltage is generated by two diode-connected PMOS transistors 551 and 552. Consequently, the NMOS source voltage $V_{560}$ and the PMOS source voltage $V_{570}$ are 0.29 V and 0.92 V, respectively. After initialization, $V_{in}$ will be centered at 0.605 V (assuming that both NMOS and PMOS transistors have the same transconductance). When $v_{in}$ is at its high level of 0.755 V, the PMOS transistor of the inverter is turned off since the PMOS source voltage is at 0.92 V, less than 0.29 V above 0.755 V. The NMOS transistor's gate to source voltage drop is (0.755−0.29)=0.465 V, which exceeds the NMOS threshold voltage of 0.29 V with a comfortable margin. Similarly, when $v_{in}$ is at its low level of 0.455 V, the NMOS transistor of the inverter is turned off since the NMOS source voltage is at 0.29 V, less than 0.29 V below 0.455 V. The PMOS transistor's gate to source voltage drop is (0.455−0.92)=−0.465 V, which exceeds the PMOS threshold voltage of −0.29 V with a comfortable margin. Hence, the first inverter stage can switch successfully with an output voltage swing between 0.29 V and 0.92 V.

The second inverter stage is powered by diode-connected PMOS transistor 555 and diode-connected NMOS transistor 556, which generates a PMOS source voltage $V_{590}$ of 1.21 V and an NMOS source voltage $V_{580}$ of 0.29 V, respectively. Since the output from the first stage $v_{out1}$ swings between 0.29 V and 0.92 V, it can successfully switch the second inverter stage without any problems. In turn, the output of the second stage $v_{out1}$ swings between 0.29 V and 1.21 V, which can successfully switch the third inverter stage powered by rail-to-rail voltages.

As shown in the example above, it is not imperative that each stage is powered by the same number (n–i) of diode-connected PMOS and NMOS transistors. In some situations, as long as the number of diode-connected transistors (on both the PMOS side and NMOS side) is one less than, or equal to, the number of diode-connected transistors on the PMOS and NMOS side respectively of the immediately preceding stage, and as long as the number of stages is low enough to amplify the input signal, yet high enough to achieve low power dissipation in the first stage and rail-to-rail output swing of the last stage, the circuit would function properly.

Figure 6:
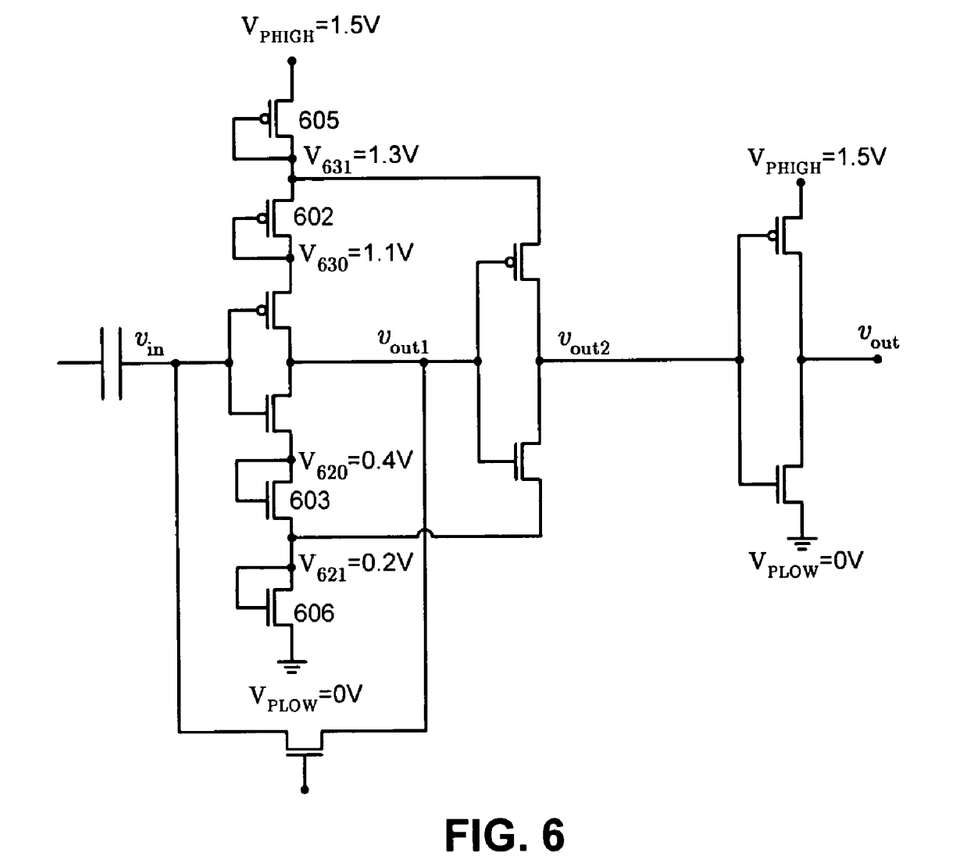
FIG. 6 illustrates an amplifier circuit incorporating three CMOS inverter stages and a pass transistor that uses diode-connected transistors coupled in series to bias the first CMOS inverter stage and provides bias voltages for the second CMOS inverter by branching from the diode-connected transistors coupled in series in accordance with an embodiment of the present invention.

FIG. 6 illustrates an amplifier circuit incorporating three CMOS inverter stages and a pass transistor that uses diode-connected transistors coupled in series to bias the first CMOS inverter stage and provides bias voltages for the second CMOS inverter by branching from the diode-connected transistors coupled in series in accordance with an embodiment of the present invention. The amplifier circuit is similar to that in FIG. 5A, and is assumed to have NMOS and PMOS transistors having threshold voltages of 0.2 V and –0.2 V, respectively. The first CMOS inverter's PMOS source voltage is biased by diode-connected transistors 602 and 605, which are coupled in series and produce 1.1 V at $V_{630}$. The second CMOS inverter's PMOS source voltage is obtained directly from $V_{631}$, between transistors 602 and 605.

Similarly, The first CMOS inverter's NMOS source voltage is biased by diode-connected transistors 603 and 606, which are coupled in series to produce 0.4 V at $V_{620}$. The second CMOS inverter's NMOS source voltage is obtained from directly $V_{621}$, between transistors 603 and 606.

Figure 7:
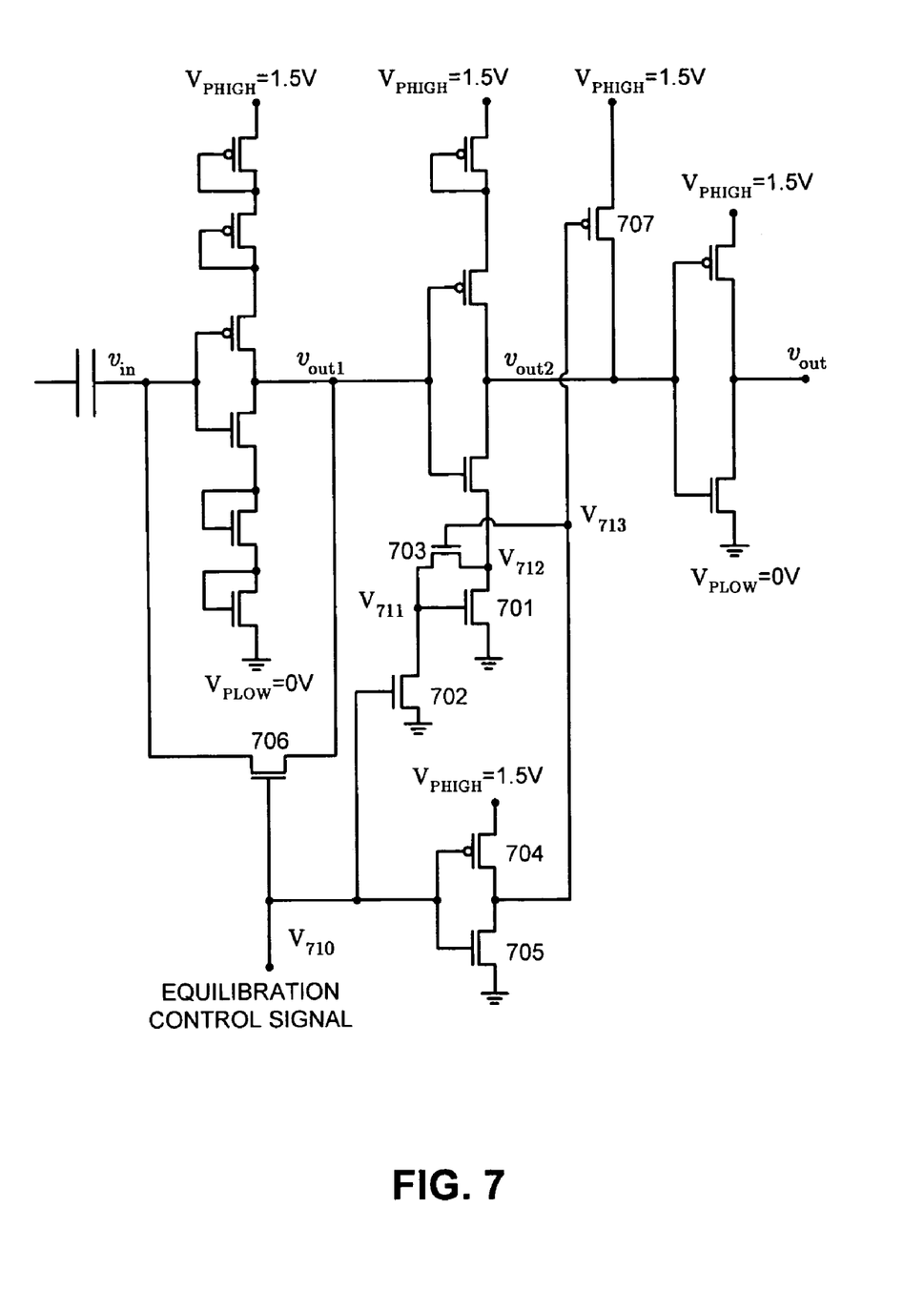
FIG. 7 illustrates one technique to reduce power consumption in the second and subsequent inverter stages during initialization in accordance to an embodiment of the present invention.

FIG. 7 illustrates one technique to reduce power consumption in the second and subsequent inverter stages during initialization in accordance to an embodiment of the present invention. Generally, during initialization, the pass transistor equilibrates $v_{in}$ with $V_{out1}$. Consequently, $v_{out1}$, is also at the switching-threshold voltage of the first inverter stage. Since $v_{out1}$ is also the input signal to the second inverter stage, if one uses the circuit configuration as shown in FIG. 5A, the PMOS transistor and NMOS transistor in the second inverter stage will both be turned on during initialization, resulting in non-negligible current draw through the second inverter stage. It is also possible that the input signals for many or all the subsequent inverter stages are not sufficiently high or low to turn off either the PMOS or NMOS transistors of the respective CMOS inverters. The overall result is that significant current flow and hence power consumption may occur during the initialization.

One approach to prevent such power consumption during initialization is to turn off either the PMOS transistor or the NMOS transistor of the CMOS inverter in the second stage, and also artificially pull the output of the second inverter stage to a low or high voltage that is sufficient to turn off either the PMOS transistor or the NMOS transistor of all the CMOS inverters in subsequent stages.

FIG. 7 shows one possible implementation. During initialization, equilibration control signal $V_{710}$ is at a high voltage level (1.5 V for example) to turn on the pass NMOS transistor 706. Consequently, both $v_{in}$ and $v_{out1}$ begin to stabilize at the switching-threshold voltage of the CMOS inverter in the first stage. Since $V_{710}$ is at 1.5 V, NMOS transistor 702 is turned on. Meanwhile, $V_{710}$ is also fed into a CMOS inverter comprising PMOS transistor 704 and NMOS transistor 705, resulting in $V_{713}$ being at a low voltage level (0 V) and NMOS transistor 703 being turned off. Consequently, the gate voltage $V_{711}$ of NMOS transistor 701 is at a low voltage level (0 V) and NMOS transistor 701 is turned off. Therefore, no current is drawn through NMOS transistor 701 and the second-stage CMOS inverter.

Furthermore, $V_{713}$ is fed into the gate of PMOS transistor 707, which is coupled between the high power-supply voltage $V_{PHIGH}$ and $V_{out2}$. Since $V_{713}$ is at 0 V during initialization, PMOS transistor 707 is turned on. Consequently, $v_{out2}$ is pulled up to $V_{PHIGH}$, which prevents subsequent inverter stages from drawing large amount of current.

When initialization is complete, equilibration control signal $V_{710}$ is turned to a low voltage level (0 V). Accordingly, NMOS transistor 702 is turned off and NMOS transistor 703 is turned on. The result is that NMOS transistor 701 becomes diode-connected and provides a properly biased low supply voltage for the second inverter stage. Accordingly, $V_{713}$ is at 1.5 V, turning off PMOS transistor 707. As a result, the output of the second inverter stage is no longer fixed to 1.5 V and can freely propagate the amplified signal to subsequent inverter stages.

It should be noted that the example in FIG. 7 is not the only way to reduce power consumption during initialization. There can be numerous implementations to achieve the same goal, i.e., to reduce current-drawing in the second and/or subsequent stages. For example, a similar configuration using PMOS transistors can be used on the PMOS side of the second-stage CMOS inverter to obtain the same effect.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for amplifying capacitively coupled inter-chip communication signals, comprising:
   receiving an input signal at a capacitive receiver pad from a capacitive transmitter pad;
   amplifying the input signal through one or more cascaded CMOS inverter stages; and
   periodically initializing the input voltage of the first CMOS inverter stage, wherein the initialization involves:
   suspending data transmission on the capacitive transmitter pad and setting the voltage on the capacitive transmitter pad to a middle point between a voltage that represents logic "1" and a voltage that represents logic "0";
   coupling the output of the first CMOS inverter stage to its input, thereby equilibrating the input voltage of the first CMOS inverter to a switching-threshold of the first CMOS inverter stage when the capacitive transmitter pad is at the middle point between the voltage that represents logic "1" and the voltage that represents logic "0", and thereby allowing a small input signal voltage swing to trigger an amplified output signal voltage swing; and
   after the input voltage of the first CMOS inverter stage substantially stabilizes at the switching threshold, uncoupling the output of the first CMOS inverter stage from the input of the first CMOS inverter stage and then resuming data transmission on the capacitive transmitter pad.

2. The method of claim 1, wherein coupling the output of the first CMOS inverter stage to its input involves coupling its output to its input through a switch, which is turned on during the initialization and then turned off before the middle-point voltage on the capacitive transmitter pad is replaced by data.

3. The method of claim 2, wherein the switch comprises one of an NMOS transistor, a PMOS transistor, and a CMOS switch.

4. The method of claim 1, wherein the preferred number of CMOS inverter stages is the minimum number satisfying inequality $[(V_{PHIGH} - V_{PLOW}) - n \cdot |V_{TP}| - n \cdot |V_{TN}|] \leq v_{in}$, where
n is the number of CMOS inverter stages;
$V_{PHIGH}$ is the high power supply voltage;
$V_{PLOW}$ is the low power supply voltage;
$V_{TP}$ is the turn-on threshold voltage of a PMOS transistor that comprises a CMOS inverter;
$V_{TN}$ is the turn-on threshold voltage of a NMOS transistor that comprises a CMOS inverter; and
$v_{in}$ is the peak-to-peak swing of the input signal received from the capacitive receiver pad.

5. The method of claim 4, wherein
the PMOS source voltage of each CMOS inverter stage is equal to or higher than the PMOS source voltage of its immediately preceding CMOS inverter stage; and wherein
the NMOS source voltage of each CMOS inverter stage is equal to or lower than the NMOS source voltage of its immediately preceding CMOS inverter stage.

6. The method of claim 5, wherein
obtaining the PMOS source voltage of each CMOS inverter stage involves coupling a number of diode-connected PMOS transistors in series between the high power supply voltage and the PMOS source of each CMOS inverter; and wherein
obtaining the NMOS source voltage of each CMOS inverter stage involves coupling a number of diode connected NMOS transistors in series between the low power supply voltage and the NMOS source of each CMOS inverter.

7. The method of claim 5, wherein the PMOS source voltage and NMOS source voltage of each CMOS inverter stage are $[V_{PHIGH} - (n-i) \cdot |V_{TP}|]$ Volts and $[V_{PLOW} + (n-i) \cdot |V_{TN}|]$ Volts, respectively, where i=1, 2, ... n is the index of each stage, and where the index of the first stage is 1 and the index of the last stage is n.

8. The method of claim 7, wherein
obtaining the PMOS source voltage of each CMOS inverter stage involves coupling (n−i) diode-connected PMOS transistors in series between the high power supply voltage and the PMOS source of each CMOS inverter according to each stage's index i; and wherein
obtaining the NMOS source voltage of each CMOS inverter stage involves coupling (n−i) diode-connected NMOS transistors in series between the low power supply voltage and the NMOS source of each CMOS inverter according to each stage's index i.

9. The method of claim 1, further comprising reducing current flow through the second or subsequent stage during initialization, and fixing the output of the second or subsequent stage to a high or low voltage sufficient to turn off a PMOS transistor or an NMOS transistor in the next stage during initialization.

10. An apparatus that amplifies capacitively coupled inter-chip communication signals, comprising:
a capacitive transmitter pad configured to transmit a signal;
a capacitive receiver pad configured to receive an input signal;
one or more cascaded CMOS inverter stages configured to amplify the input signal;
an initialization mechanism configured to periodically initialize the input voltage of the first CMOS inverter stage, wherein the initialization mechanism is also configured to,
suspend data transmission on the capacitive transmitter pad and set the voltage on the capacitive transmitter pad to a middle point between a voltage that represents logic "1" and a voltage that represents logic "0",
couple the output of the first CMOS inverter stage to its input, thereby equilibrating the input voltage of the first CMOS inverter to a switching-threshold of the first CMOS inverter stage when the capacitive transmitter pad is at the middle point between the voltage that represents logic "1" and the voltage that represents logic "0", and thereby allowing a small input signal voltage swing to trigger an amplified output signal voltage swing; and
after the input voltage of the first CMOS inverter stage substantially stabilizes at the switching threshold, uncouple the output of the first CMOS inverter stage from the input of the first CMOS inverter stage and then resuming data transmission on the capacitive transmitter pad.

11. The apparatus of claim 10, wherein the output of the first CMOS inverter stage is coupled to its input through a switch, which is turned on during the initialization and then turned off before the middle-point voltage on the capacitive transmitter pad is replaced by data.

12. The apparatus of claim 11, wherein the switch comprises one of an NMOS transistor, a PMOS transistor, and a CMOS switch.

13. The apparatus of claim 10, wherein the preferred number of CMOS inverter stages is the minimum number satisfying inequality $[(V_{PHIGH} - V_{PLOW}) - n \cdot |V_{TP}| - n \cdot |V_{TN}|] \leq v_{in}$, where
n is the number of CMOS inverter stages;
$V_{PHIGH}$ is the high power supply voltage;
$V_{PLOW}$ is the low power supply voltage;
$V_{TP}$ is the turn-on threshold voltage of a PMOS transistor that comprises a CMOS inverter;
$V_{TN}$ is the turn-on threshold voltage of a NMOS transistor that comprises a CMOS inverter; and
$v_{in}$ is the peak-to-peak swing of the input signal received from the capacitive receiver pad.

14. The apparatus of claim 13, wherein
the PMOS source voltage of each CMOS inverter stage is equal to or higher than the PMOS source voltage of its immediately preceding CMOS inverter stage; and wherein
the NMOS source voltage of each CMOS inverter stage is equal to or lower than the NMOS source voltage of its immediately preceding CMOS inverter stage.

15. The apparatus of claim 14, wherein
a number of diode-connected PMOS transistors are coupled in series between the high power supply voltage and the PMOS source of each CMOS inverter; and wherein
a number of diode-connected NMOS transistors are coupled in series between the low power supply voltage and the NMOS source of each CMOS inverter.

16. The apparatus of claim 14, wherein the PMOS source voltage and NMOS source voltage of each CMOS inverter stage are $[V_{PHIGH}-(n-i)\cdot |V_{TP}|]$ Volts and $[V_{PLOW}+(n-i)\cdot |V_{TN}|]$ Volts, respectively, where i=1, 2, . . . n is the index of each stage, and where the index of the first stage is 1 and the index of the last stage is n.

17. The apparatus of claim 16, wherein
   (n−i) diode-connected PMOS transistors are coupled in series between the high power supply voltage and the PMOS source of each CMOS inverter according to each stage's index i; and wherein
   (n−i) diode-connected NMOS transistors are coupled in series between the low power supply voltage and the NMOS source of each CMOS inverter according to each stage's index i.

18. The apparatus of claim 10, further comprising a mechanism configured to reduce current flow through the second or subsequent stage during initialization, and to fix the output of the second or subsequent stage to a high or low voltage sufficient to turn off a PMOS transistor or an NMOS transistor in the next stage during initialization.

19. A computer system that amplifies capacitively coupled inter-chip communication signals, comprising:
   a processor located on a first chip;
   a memory located on a second chip;
   a capacitive transmitter pad on the first or second chip configured to transmit a signal;
   a capacitive receiver pad on the other of the first or the second chip configured to receive an input signal;
   one or more cascaded CMOS inverter stages configured to amplify the input signal;
   an initialization mechanism configured to periodically initialize the input voltage of the first CMOS inverter stage, wherein the initialization mechanism is configured to,
      suspend data transmission on the capacitive transmitter pad and set the voltage on the capacitive transmitter pad to a middle point between a voltage that represents logic "1" and a voltage that represents logic "0",
      couple the output of the first CMOS inverter stage to its input, thereby equilibrating the input voltage of the first CMOS inverter to a switching threshold of the first CMOS inverter stage when the capacitive transmitter pad is at the middle point between the voltage that represents logic "1" and the voltage that represents logic "0", and thereby allowing a small input signal voltage swing to trigger an amplified output signal voltage swing; and
      after the input voltage of the first CMOS inverter stage substantially stabilizes at the switching threshold, uncouple the output of the first CMOS inverter stage from the input of the first CMOS inverter stage and then resuming data transmission on the capacitive transmitter pad.

20. The computer system of claim 19, wherein the output of the first CMOS inverter stage is coupled to its input through a switch, which is turned on during the initialization and then turned off before the middle-point voltage on the capacitive transmitter pad is replaced by data.

21. The computer system of claim 20, wherein the switch comprises one of an NMOS transistor, a PMOS transistor, and a CMOS switch.

22. The computer system of claim 19, wherein the preferred number of CMOS inverter stages is the minimum number satisfying inequality $[(V_{PHIGH}-V_{PLOW})-n\cdot|V_{TP}|-n\cdot|V_{TN}|] \leq v_{in}$, where
   n is the number of CMOS inverter stages;
   $V_{PHIGH}$ is the high power supply voltage;
   $V_{PLOW}$ is the low power supply voltage;
   $V_{TP}$ is the turn-on threshold voltage of a PMOS transistor that comprises a CMOS inverter;
   $V_{TN}$ is the turn-on threshold voltage of a NMOS transistor that comprises a CMOS inverter; and
   $v_{in}$ is the peak-to-peak swing of the input signal received from the capacitive receiver pad.

23. The computer system of claim 22, wherein
   the PMOS source voltage of each CMOS inverter stage is equal to or higher than the PMOS source voltage of its immediately preceding CMOS inverter stage; and wherein
   the NMOS source voltage of each CMOS inverter stage is equal to or lower than the NMOS source voltage of its immediately preceding CMOS inverter stage.

24. The computer system of claim 23, wherein
   a number of diode-connected PMOS transistors are coupled in series between the high power supply voltage and the PMOS source of each CMOS inverter; and wherein
   a number of diode-connected NMOS transistors are coupled in series between the low power supply voltage and the NMOS source of each CMOS inverter.

25. The computer system of claim 23, wherein the PMOS source voltage and NMOS source voltage of each CMOS inverter stage are $[V_{PHIGH}-(n-i)\cdot|V_{TP}|]$ Volts and $[V_{PLOW}+(n-i)\cdot|V_{TN}|]$ Volts, respectively, where i=1, 2, . . . n is the index of each stage, and where the index of the first stage is 1 and the index of the last stage is n.

26. The computer system of claim 25, wherein
   (n−i) diode-connected PMOS transistors are coupled in series between the high power supply voltage and the PMOS source of each CMOS inverter according to each stage's index i; and wherein
   (n−i) diode-connected NMOS transistors are coupled in series between the low power supply voltage and the NMOS source of each CMOS inverter according to each stage's index i.

27. The computer system of claim 19, further comprising a mechanism configured to reduce current flow through the second or subsequent stage during initialization, and to fix the output of the second or subsequent stage to a high or low voltage sufficient to turn off a PMOS transistor or an NMOS transistor in the next stage during initialization.

* * * * *